United States Patent [19]
Okabe et al.

[11] Patent Number: 5,973,338
[45] Date of Patent: Oct. 26, 1999

[54] INSULATED GATE TYPE BIPOLAR-TRANSISTOR

[75] Inventors: Naoto Okabe, Chita-gun; Norihito Tokura, Okazaki; Naohito Kato, Kariya, all of Japan

[73] Assignee: Nippondenso Co., Ltd, Kariya, Japan

[21] Appl. No.: 08/947,402

[22] Filed: Oct. 8, 1997

Related U.S. Application Data

[63] Continuation of application No. 08/524,158, Aug. 16, 1995, abandoned, which is a continuation of application No. 08/173,860, Dec. 23, 1993, abandoned, which is a continuation of application No. 07/849,689, Mar. 11, 1992, abandoned.

[30] Foreign Application Priority Data

Mar. 12, 1991 [JP] Japan .................................. 3-046710

[51] Int. Cl.$^6$ ........................... H01L 29/74; H01L 31/111
[52] U.S. Cl. ........................................... 257/133; 257/139
[58] Field of Search ..................................... 257/133, 139

[56] References Cited

U.S. PATENT DOCUMENTS

| | | | |
|---|---|---|---|
| 4,041,517 | 8/1977 | Fuse et al. | 257/142 |
| 4,972,239 | 11/1990 | Mihara | 257/142 |
| 4,985,741 | 1/1991 | Bauer et al. | 357/34 |
| 4,985,743 | 1/1991 | Tokura et al. | 357/39 |
| 4,994,871 | 2/1991 | Chang et al. | 257/139 |
| 5,095,343 | 3/1992 | Klodzinski et al. | 257/328 |
| 5,399,883 | 3/1995 | Baliga | 257/493 |

FOREIGN PATENT DOCUMENTS

| | | |
|---|---|---|
| 080044 | 6/1983 | European Pat. Off. . |
| 416805 | 3/1991 | European Pat. Off. . |
| 35 19 389 A1 | 12/1985 | Germany . |
| 64-54765 | 8/1987 | Japan .................. H01K 29/78 |
| 64-81270 | 9/1987 | Japan .................. H01L 29/78 |
| 2-112285 | 10/1988 | Japan ................. H01L 29/784 |
| 2112285 | 10/1988 | Japan . |
| 3-44969 | 6/1989 | Japan ................. H01L 29/784 |
| 344969 | 6/1989 | Japan . |
| WO9103842 | 3/1991 | WIPO ................. H01L 29/784 |

OTHER PUBLICATIONS

Appels et al "High Voltage Thin Layer Devices (Resure)", IEDM, Dec. 1979, 238–241.

Muller et al *Device Electronics for IC's,* pp. 131–133, 1986.

Muller et al, *Device Electronics for IC's,* p. 204, 1986.

S.M. Sze, "Physics of Semiconductor Devices", 2nd Edition, 1981, pp. 194–195.

B. Jayant Bagliga, "Analysis of the Output Conductance of Insulated Gate Transistors", IEEE Electron Device Letters, vol. EDL–7, No. 12, Dec. 1986, pp. 686–688.

Muller et al. "Device Electronics for IC's", p. 204, 1986.

*Primary Examiner*—Stephen D. Meier
*Attorney, Agent, or Firm*—Pillsbury Madison & Sutro LLP

[57] ABSTRACT

An insulated gate type bipolar-transistor (IGBT) incorporates an excess voltage protecting function and drain voltage fixing function in a monolithic structure. Impurity concentration ND and the thickness of an n$^-$ type drain layer (3) is set so that a depletion region propagating from a p type base layer (7) reaches a p$^+$ type drain layer at a voltage ($V_{DSP}$) lower than a voltage ($V_{DSS}$) at which avalanche breakdown is caused within the IGBT element when voltage is applied between the source and the drain.

15 Claims, 5 Drawing Sheets

INSULATED GATE TYPE BIPOLAR-TRANSISTOR

This is a continuation of Ser. No. 08/524,158, filed Aug. 16, 1995, now abandoned which is a continuation of application Ser. No. 08/173,860, filed on Dec. 23, 1993, which was abandoned upon the filing hereof which was a continuation of application Ser. No. 07/849,689, filed Mar. 11, 1992, now abandoned.

BACKGROUND OF THE INVENTION

1. Field of the Invention

The present invention relates to an insulated gate type bipolar-transistor (hereafter referred to as "IGBT") integrating an excess voltage protecting function or drain voltage fixing function.

2. Description of the Related Art

Upon turning ON a power switching element employed as an inverting device for a motor circuit or a non-interruption power source circuit, a high voltage can be induced on an inductive load or a floating inductance in the circuit due to abrupt variation of circuit current flowing through the circuit. This high voltage is applied to the power switching element as a spike voltage to cause fatigue or breakage of the power switching element. As a means for protecting the power switching element from excess voltage, a voltage clamp circuit including a constant voltage diode based on the operation principle of avalanche breakdown for turning ON the constant voltage diode before breakdown occurs in the power switching element because of applied spike voltage and thus fixing the level of the spike voltage within a safe operation range, is employed.

In the case that IGBT is employed as the power switching element, a similar means can be applied. In this case, the constant voltage diode is externally connected between the drain and gate the IGBT element. However, it causes an increase in of the assembling cost and also increases the overall circuit dimension. It can form the constant voltage diode integrally with the IGBT element by depositing a polycrystalline silicon layer on the substrates formed thereon the IGBT element to form the constant diode therein. However, this increases the necessary number of photo-masks in the element fabrication process leading to an increase in the production cost. Furthermore, in order to form the constant voltage diode on the surface of the IGBT element, it becomes necessary to make the area for a cell region smaller or increase the chip dimension.

As a solution for this problem, Japanese Unexamined Patent Publication No. 64-81270 proposes a method for integrating the constant voltage diode, in which the constant voltage diode having an operational principle of avalanche breakdown, is incorporated in the IGBT element so that the constant voltage diode is disposed between the drain and the source on the equivalent circuit. This method solves problems, such as narrowing of the chip area of the IGBT element. The proposed construction is shown in FIG. 6.

In FIG. 6, the reference numeral 61 denotes a source electrode, 62 denotes a drain electrode, 63 denotes a gate electrode. The upper layer of a substrate is composed of an insulating gate of DSA construction, $p^+$ base layer 65, $n^+$ source layer 66 and forms a p type channel immediately below the gate. On the other hand, observing the vertical structure, the substrate has a npnp four layer structure including $n^+$ source layer 66, $p^+$ base layer 65, $n^-$ drain layer 67 and $p^+$ drain layer 64 between $n^+$ layer 68 and drain electrode 62.

The $p^+$ drain layer 64 at the side of the drain electrode 62 is separated into respective small segments and arranged parallel in a honeycomb fashion. This forms a structure, in which a diode with a pn junction is disposed between the collector and the emitter of a pnp transistor parallel thereto. The diode has a portion 69 of $n^+$ layer projecting into the $n^-$ layer 67 to be positioned closer to the $p^+$ layer 65 to provide avalanche type diode characteristics and thus protect the IGBT element from excess voltage.

However, in order to incorporate the constant voltage diode, it is essential to provide $n^+$ layer 68 at the drain side of the substrate. Because of the presence of $n^+$ layer 68, hole injection from the drain side upon conducting the IGBT is restricted to make the ON voltage higher.

In addition, for fabricating the $p^+$ layer in the honeycomb configuration at the side of the drain electrode 62 and to extend the part 69 of the $n^+$ layer 68 into the $n^-$ drain layer 67, the substrate structure becomes complicated and thereby increases costs for fabrication of the wafer and costs for production.

SUMMARY OF THE INVENTION

In view of the problems set forth above, it is an object of the present invention to provide an IGBT element that incorporates excess voltage protection and drain voltage fixing function in a monolithic structure with a function for clamping a drain-source voltage without causing an increase in the ON voltage.

In order to accomplish the aforementioned and other objects, instead of incorporating the constant voltage diode having an operational principle of avalanche breakdown in the IGBT element, the present inventors propose a structure in which avalanche breakdown is suppressed within an IGBT element under a desired clamping condition of drain-source voltage and a minority carrier is injected from $p^+$ substrate to $n^-$ layer.

Namely, an IGBT, according to the present invention, comprises a first layer made of a first conduction type semiconductor at the side of a drain electrode, a second layer made of a second condition type semiconductor formed on the first layer and causing conductivity modulation by the injection of a carrier thereon, a third layer made of a first conduction type semiconductor selectively formed on the surface of the second layer, a fourth layer made of a second conduction type semiconductor selectively formed on the surface of the third layer, the third layer between the second and fourth layers serving as a channel region and formed with a gate electrode via a gate insulation layer, a source electrode extending between the surfaces of the third and fourth layers. The IGBT further has the following feature.

At first, the impurity concentration and thickness of the second layer made of a second conduction type semiconductor are set at a predetermined value so that when depletion region propagates from pn junction at the interface between the third layer and the second layer into the second layer, the depletin region may reach the first layer through the second layer at a voltage lower than a critical voltage, which can result in the occurrence of avalanche breakdown at the part of the depletion region, so as to reduce a potential barrier at pn junction between the first and second layers and thus causing an injection of a minority carrier from the first layer to the second layer upon application of voltage for the drain electrode and the source electrode.

Furthermore, a fifth layer made of a second conduction type semiconductor disposed on or in the vicinity of the pn junction forming the interface between the first and second layers having higher impurity concentration than that of the second layer, and formed into a predetermined pattern leaving the interface surface between the first and second layers for the transfer of the carrier therebetween, may be constructed.

BRIEF DESCRIPTION OF THE DRAWINGS

The present invention will be more clearly understood from the description set forth below with reference to the accompanying drawings, wherein.

DESCRIPTION OF THE PREFERRED EMBODIMENT

Figure 1:
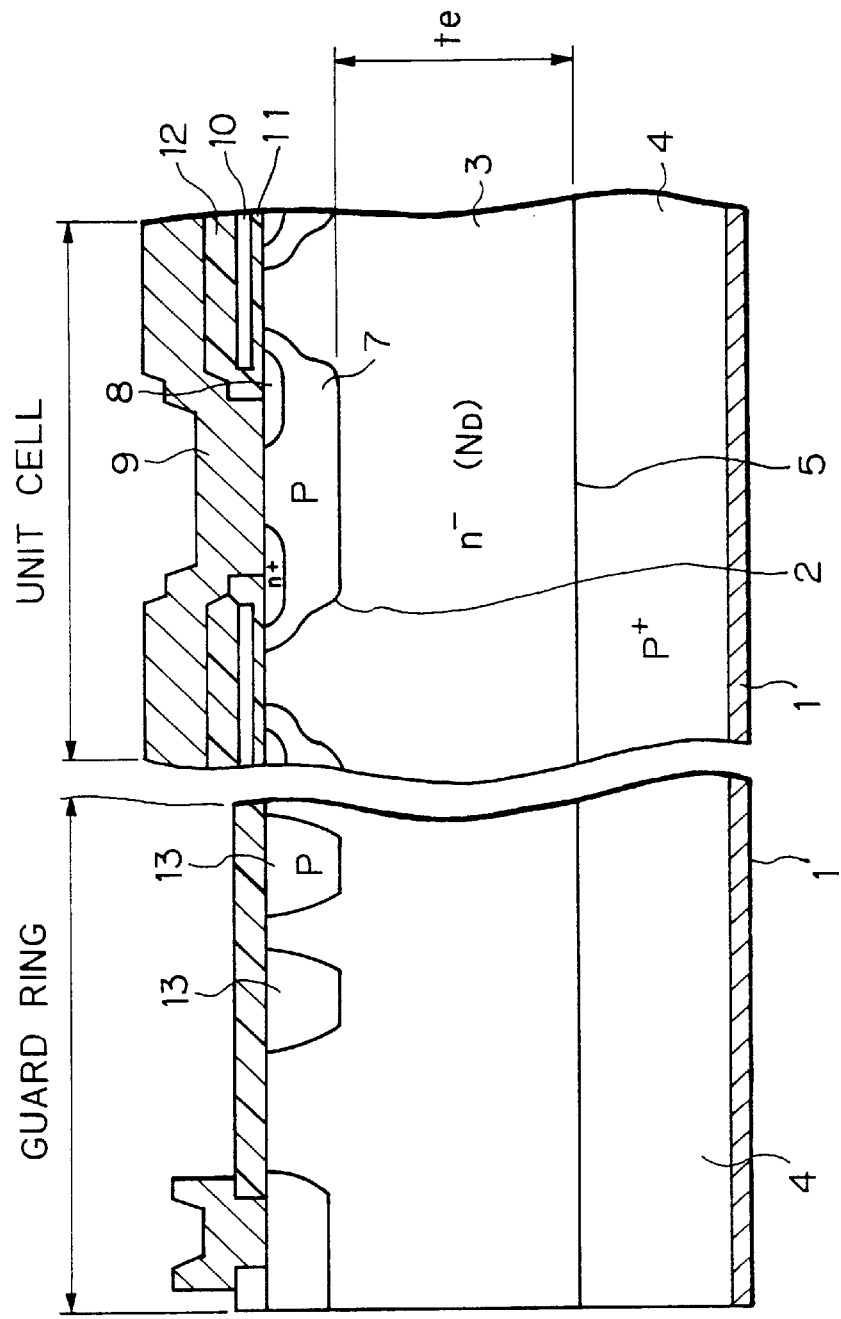
FIG. 1 is a section showing a unit cell and an outer peripheral guard ring portion of the first embodiment of IGBT according to the present invention.

Hereafter, an operation of a n channel type IGBT will be discussed such that the first conduction type is a p type and the second conduction type is an n type.

When a positive voltage is applied to a drain electrode relative to a source electrode, a pn junction formed between the second n type semiconductor layer and the third p type semiconductor layer is in a reverse biased condition. Then, a depletion region propagates from this pn junction. Here, if the second n type semiconductor layer has lower impurity concentration in comparison with the third p type semiconductor layer, the depletion region propagates within the second n type semiconductor layer toward the first p type semiconductor layer according to an increase of the voltage between the source electrode and the drain electrode.

When the depletion region reaches a pn junction formed between the first p type semiconductor layer and the second n type semiconductor layer, it reduces a potential barrier formed by diffusion potential at the pn junction. By this, from the first p type semiconductor layer to the second n type semiconductor layer, a hole as a minority carrier is injected. The hole flows through the void formed in the second n type semiconductor layer to reach the third p type semiconductor layer and then flows to the source electrode. Furthermore, the hole flows to the source electrode via the third p type semiconductor layer as a drift current because of the electric field within the depletion region.

With the mechanism set forth above, a current rapidly flows between the source electrode and the drain electrode to suppress an increase of the voltage between the source electrode and the drain electrode. This phenomenon is known as a punch through phenomenon in the bipolar-transistor to form a void in all regions of the base layer and create the current between the collector and emitter. The present invention applies this phenomenon to the IGBT.

Here, the voltage $V_{DSP}$ between the source electrode and the drain electrode, at which the current starts to flow, is a charge voltage, at which the end of the depletion region reaches the first p type semiconductor layer through the second n type semiconductor layer. Therefore, the level of the voltage $V_{DSP}$ can be set by selecting the thickness and impurity concentration of the second n type semiconductor layer. Namely, by setting the thickness and impurity concentration of the second n type semiconductor layer so that the $V_{DSP}$ becomes within the safe operation region of the element (first feature), it becomes possible to protect the IGBT element from excess voltage.

Furthermore, by a rapid increase of the drain current, the source-drain voltage becomes fixed in the vicinity of a particular voltage. As can be appreciated herefrom, with the construction, the function preventing the source-drain voltage from rising across a given voltage and, at the same time, fixing the voltage at a particular voltage range, can be internally incorporated.

In addition to the above-mentioned first feature, by providing the fifth n type semiconductor layer having a high impurity concentration and a given pattern leaving pn junction area, at or in the vicinity of the pn junction between the first p type semiconductor layer and the second n type semiconductor layer (second feature), an injection amount of carrier (hole) to be injected into the second n type semiconductor layer via the pn junction when the depletion region reaches the first p type semiconductor layer, can be restricted and thus can restrict the formation of a conductivity modulated region and the reduction of resistance associated with injection of the hole. As a result, at the rising of the drain current, fluctuation of drain voltage because of conductivity modulation caused by an injection of a minority carrier can be suppressed to make the drain voltage more stable upon starting the current flow through the element.

As set forth above, according to the present invention, by setting the impurity concentration and thickness of the second semiconductor layer at predetermined values, avalanche breakdown can be internally suppressed in the IGBT element at a desired condition corresponding to a desired clamp voltage between the drain and the source. Furthermore, since the invention injects a minority carrier from p$^+$ substrate to n$^-$ substrate, it becomes unnecessary to incorporate the constant voltage diode having an operation principle of avalanche breakdown. Therefore, the present invention can achieve a remarkable advantage in that the IGBT element incorporating excess voltage protection and a drain voltage fixing function in a monolithic structure with a function for clamping drain-source voltage without causing an increase in the ON voltage.

FIG. 1 is a section of a unit cell and a guard ring of the first embodiment of an IGBT according to the present invention. The structure will be discussed in order of fabrication.

At first, with a monocrystalline silicon substrate, a p$^+$ drain layer 4 (first semiconductor layer) is prepared. On the p$^+$ drain layer 4, a high resistance n$^-$ drain layer 3 (second semiconductor layer) is formed by growing monocrystalline silicon by way of vapor deposition or so forth. This n$^-$ drain layer 3 has a predetermined impurity concentration ND and a predetermined thickness te, as set out later. Next, for a depth of 3 to 6 μm, a p type base layer 7 (third layer) and a p type layer 13 are formed simultaneously by way of selective diffusion. Here, the p type layer 13 is a guard ring formed for providing high breakdown voltage. Then, within the p type base layer 7, an n$^+$ source layer 8 (fourth layer) is formed by way of selective diffusion. It should be noted that, during the fabrication process set forth above, the p type base layer and the n⁺ type source layer 8 are self-alignment using DSA (Diffusion Self Alignment) technology using a gate electrode 10 formed on a gate oxide layer 11 formed by oxidation of the surface of the n⁻ drain layer 3 as a mask, and thus forms a channel region. Subsequently, an interlayer insulation layer 12 is formed. Thereafter, to establish an ohmic contact formed between the p type base layer 7 and the n⁺ source layer 8, contact holes are formed through the gate oxide layer and the interlayer insulation layer 12. Then, through deposition of several $\mu$m of aluminum and selective etching, a source electrode 9 and gate electrode pad (not shown) are formed. Then, a metal layer is deposited on the reverse side of the p⁺ type drain layer 4 to form a drain electrode 1.

Here, the impurity concentration ND and the thickness $t_e$ from the lower surface of the p type base layer 7 of the n⁻ drain layer 3 are set so that a depletion region propagates from the p type base layer 7 and reaches the p⁺ type drain layer 4 through the n⁻ drain layer 3 at a voltage smaller than an avalanche breakdown voltage of a pn junction between the p type base layer 7 and the n⁻ drain layer 3. Namely when a voltage is applied between the source and the drain, the depletion region propagating from the p type base layer 7 reaches the p⁺ drain layer at a voltage $V_{DSP}$ lower than a voltage $V_{DSA}$ at which an avalanche breakdown occurs in the element.

Here, a pn⁻ junction of a one-side abrupt junction, a relationship between a width W of void layer and a reverse bias voltage $V_R$ can be expressed by the following equation (1)

$$W = \frac{V_R + \phi_B}{V_R} \sqrt{\frac{2K_s\varepsilon_0 V_R}{qN_D}} \tag{1}$$

where
$\phi$B is diffusion potential of pn⁻ junction;
$K_S$ relative dielectric constant, in case of Si 11.7;
$\varepsilon_0$ is a dielectric constant at vacuum
q is an elemental amount of charge;
$N_D$ is the impurity concentration in n⁻ drain layer 3; and
Here, since $V_R \gg \phi B$, the foregoing equation is approximated by:

$$W = \sqrt{\frac{2K_s\varepsilon_0 V_R}{qN_D}} \tag{2}$$

For example, assuming $N_D=2.0\times10^{14}$ cm⁻³, from the foregoing equation (2), when $V_R=350V$, $W=48$ $\mu$m. Accordingly, by setting the impurity concentration $N_D$ and the thickness $t_e$ of the n⁻ type drain layer 3 of the IGBT structure to $N_D=2.0\times10^{14}$ cm⁻³ and $t_e=48$ $\mu$m, the voltage $V_{DSP}$ to case carrier injection from the p⁺ drain layer 4 as the substrate, can be set at 350V.

An excess voltage protecting function and a drain voltage fixing function in the IGBT and constructed as set forth above will be discussed herebelow.

When positive voltage $V_D$ is applied to the drain electrode 1 while maintaining the potential at the source electrode 9 and the gate electrode 10 at the ground level, a depletion region is formed in n⁻ type drain layer 3 because of reverse bias at the pn junction 2 between the p type base layer 7 and the n⁻ drain layer 3. The depletion region propagates within the n⁻ drain layer 3 toward the p⁺ type drain layer 4 according to an increase in the voltage $V_D$. When the voltage $V_D$ reaches $V_{DSP}$, the end of the depletion region reaches the p⁺ drain layer 4. At this time, the electric charge in the IGBT element becomes a maximum value Emax at a flat portion of an interface (pn junction 2) between the p type base layer 7 and n⁻ type drain layer 3. The maximum value Emax can be expressed by the following equation (3):

$$E_{max} = \frac{qN_D W}{K_s\varepsilon_0} = 1.5\times10^5 \tag{3}$$

On the other hand, at the impurity concentration of $2.0\times10^{14}$ cm⁻³, the critical field Ecrit at avalanche breakdown can be expressed by:

$$\text{Ecrit}=2.3\times10^5 [V/cm] \tag{4}$$

Accordingly, from the equations (3) and (4), since Emax<Ecrit, avalanche breakdown can be successfully suppressed.

From equation (3) above, those skilled in the art would understand that if the impurity concentration is set to a given value and a given electric field $E_{CRIT}$, which is sufficient to cause an avalanche breakdown at some width W, is generated at the pn junction 2, the width $W_{CRIT}$ of the depletion region at which the given electric field $E_{CRIT}$ causes the avalanche breakdown is defined as follows:

$$W\text{crit} = \frac{KS\cdot\varepsilon_0 \cdot E\text{crit}}{q\cdot ND}.$$

Thus, $W_{CRIT}$ represents the distance between junction 2 and junction 5 (see FIG. 1 of the present application) at which an avalanche breakdown will occur when an electric field $E_{CRIT}$ is generated junction 2 and when the impurity concentration of drain layer 3 is set to a predetermined value. Because $E_{max}$ must be less than $E_{crit}$ to avoid an avalanche breakdown, those skilled in the art would recognize that distance $t_e$ (i.e., W) should be selected so as to be less than $W_{CRIT}$.

At this time, the potential barrier at the pn junction 5 formed between the p⁺ type drain layer 4 and the n⁻ drain layer 3 is reduced, injection of a hole from the p⁺ drain layer 4 to n⁻ drain layer is initiated, the hole flows to the source electrode 9 through the p type base layer 7 as a drift current by the effect of an electric field in the depletion region. By this, a current rapidly flowing between the source and the drain to suppress a rise in the drain voltage. Therefore, at the bias condition, in which avalanche breakdown is eliminated, an excess voltage protecting function in terms of the drain current can be realized.

On the other hand, because of the increase in the drain current, the voltage between the source and drain can be fixed in the vicinity of the particular voltage $V_{DSP}$. Therefore, the drain voltage fixing function can be realized.

It should be noted that for the foregoing equations (1) through (4), written reference is made by A. S. Grove, translated by Yasuo Tarui, "Foundation for Semiconductor Device" McGlaw-Hill, pages 176–179 and 215. The discussion in this publication is herein incorporated by reference for the sake of disclosure.

Figure 2:
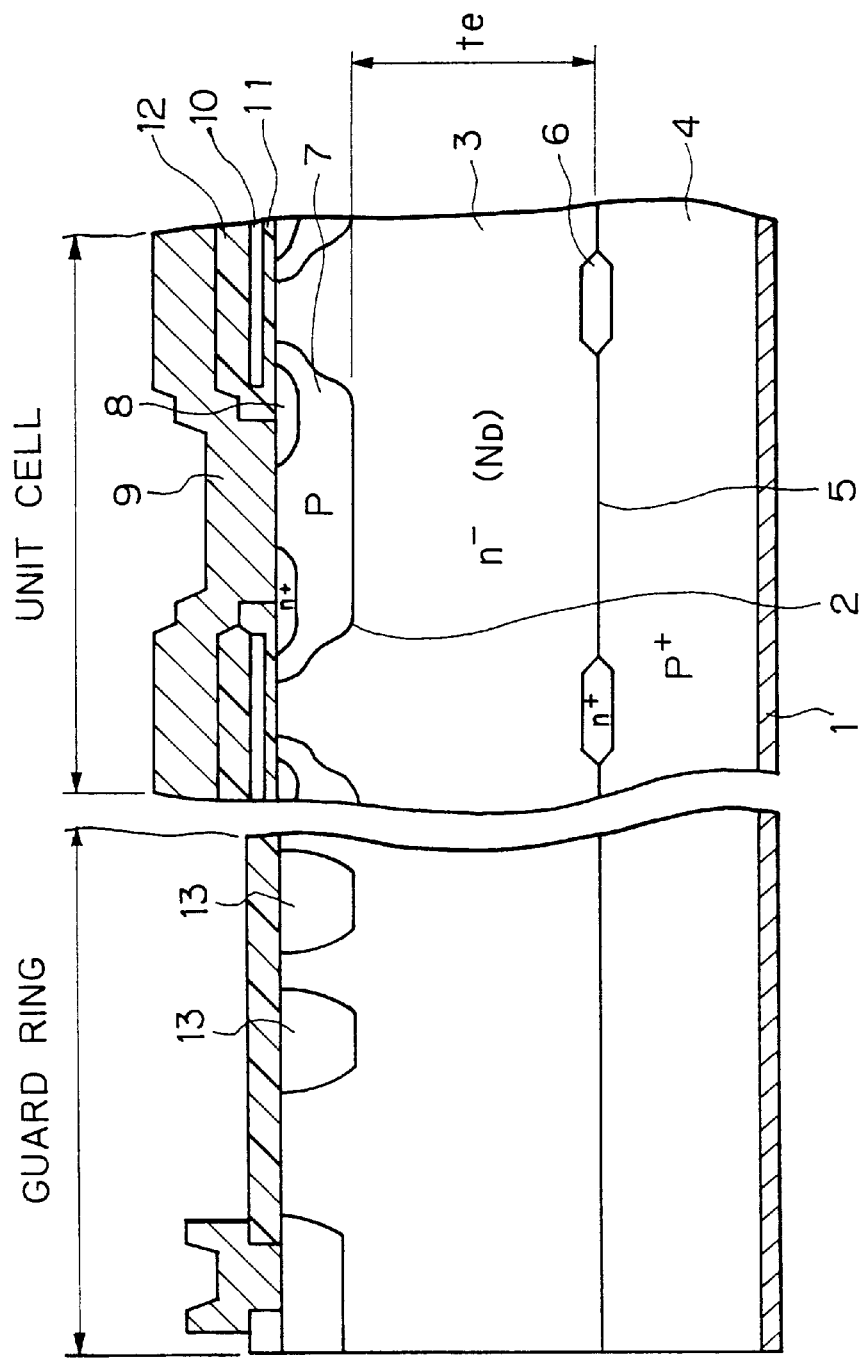
FIG. 2 is a section showing a unit cell and an outer peripheral guard ring portion of the second embodiment of IGBT according to the invention.

FIG. 2 shows a section of a unit cell and a guard ring of the second embodiment of IGBT according to the present invention. The shown embodiment is differentiated from that illustrated in FIG. 1, in that an n⁺ layer having a cyclic stripe pattern is provided in the vicinity of the pn junction 5 of the substrate. The n⁺ layer 6 is formed at or in the vicinity of junction 5 by selective diffusion of an impurity on the surface of the p⁺ type drain layer 4, or, as an alternative, by forming a n⁻ layer with a certain thickness on the surface of the p⁺ type drain layer 4, subsequently performing selective diffusion of an impurity, and then performing the fabrication process discussed with respect to the first embodiment. It should be noted that similar elements are represented by the same reference numerals as in the foregoing first embodiment.

Discussion will be provided for an excess voltage protecting function and the voltage fixing function in terms of drain voltage with respect to the IGBT element constructed as set forth above.

When a positive voltage $V_D$ is applied to the drain electrode 1 while maintaining the potential at the source electrode 9 and the gate electrode 10 at the ground level, the depletion region is formed in n⁻ type drain layer 3 because of reverse bias at the pn junction 2 between the p type base layer 7 and the n⁻ drain layer 3. The depletion region propagates within the n⁻ drain layer 3 toward the p⁺ type drain layer 4 according to an increase in the voltage $V_D$. When the end of the depletion region reaches the position where the n⁺ layer 6 is formed, propagation of the depletion region is blocked at the region where the n⁺ layer 6 is selectively formed. On the other hand, in the region where the n⁺ region is not formed, the depletion region reaches the pn junction to reduce the potential barrier thereat to cause injection of a hole in substantially the same manner as that discussed in the first embodiment.

Therefore, in the structure of the illustrated embodiment of the IGBT, by selectively forming the n⁺ type layer, the area to inject a hole can be restricted. The effect of this structure will be discussed in comparison with the structure that does not have the n⁺ type layer 6.

Figure 3:
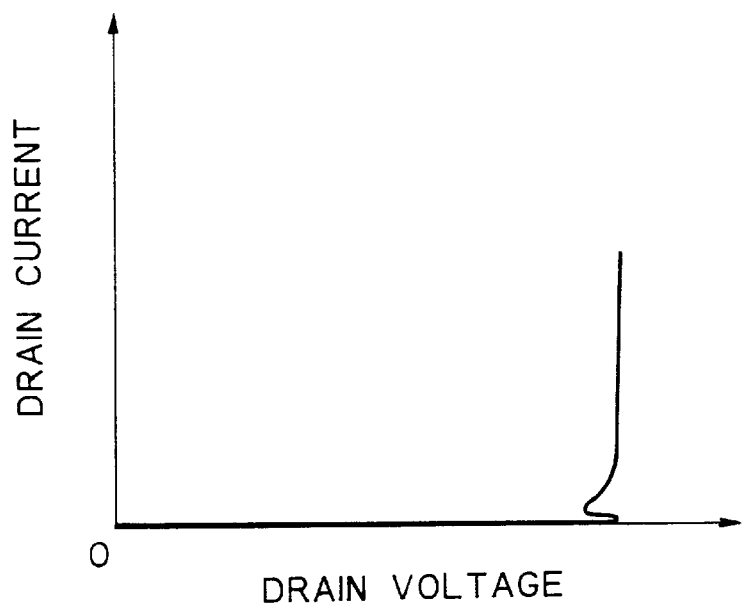
FIG. 3 is an electric characteristic chart of the IGBT of FIG. 1.
Figure 4:
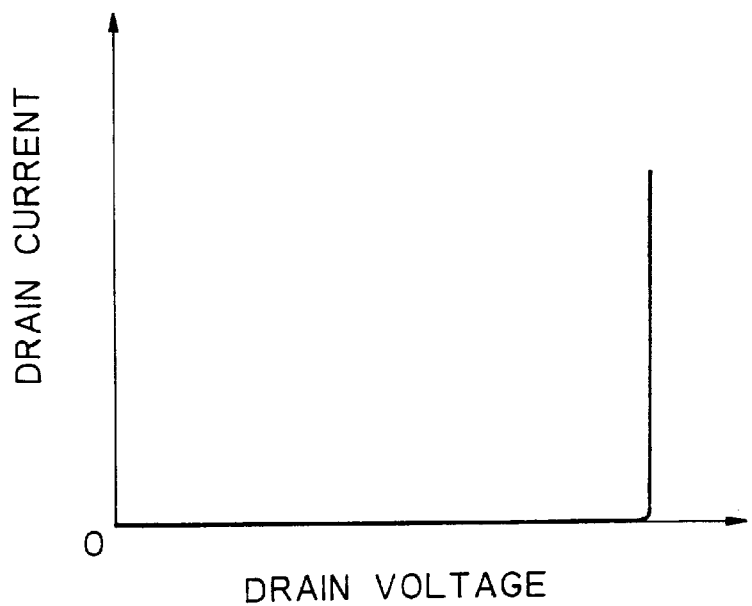
FIG. 4 is an electric characteristic chart of the IGBT of FIG. 2.

In the case that the n⁺ type layer 6 is not provided, when the depletion region reaches the p⁺ type drain layer to start injection of a hole to the n⁻ type drain layer 4, a region where the minority carrier is increased, is formed in the vicinity of pn junction 5 of the substrate. In such a region, the conductivity is lowered (conductivity modulation) to cause a lowering of resistance between the source electrode and the drain electrode. At this time, the relationship between the drain current versus the drain voltage shows negative characteristics to decrease the drain voltage according to an increase in the drain current. When the drain current is further increased, as propagation of the conductivity modulated region is restricted and thus the resistance between the source electrode and the drain electrode becomes fixed to cause an increase in the drain voltage again. Therefore, as shown in FIG. 3, the characteristics becomes I–V characteristics with a slight fluctuation of the drain voltage at the initiation of a current flow.

Namely, the fluctuation of the drain voltage at the region of initiation of a flow of drain current is caused by a reduction of the element resistance due to the formation of the conductivity modulated region in the vicinity of the pn junction 5 by an injection of a minority carrier (hole) to the n⁻ drain layer 3.

In contrast to this, in the construction where the n⁺ type layer 6 is provided as shown in FIG. 2, when the depletion region reaches the p⁺ type drain layer 4, the region where injection of the hole to the n⁻ type drain layer 3 via the pn junction 5 of the substrate, is restricted. Accordingly, an area forming the conductivity modulated region, and a reduction of the element resistance are restricted. Therefore, the drain voltage will never fluctuate even at the initiation of a flow of the drain current, and thus can be stably fixed.

In addition, by forming the n⁺ type layer 6 as a cyclic repeated pattern over the overall surface of the element, it becomes possible to make the current density flowing through the element uniform.

It should be appreciated that, although FIG. 2 shows the example in which the n⁺ type layer 6 is formed at the interface (pn junction 5) of the p⁺ type drain layer 4 and the n⁻ type drain layer 3, the equivalent effect can be obtained even when the n⁺ type layer is formed at an upper or lower position from the interface surface of the p⁺ type drain layer 4 and the n⁻ type drain layer 3. Also, the pattern of the n⁺ type layer 6 is not specified as a stripe pattern but can be any pattern, such as a net pattern or so forth.

Figure 5A:
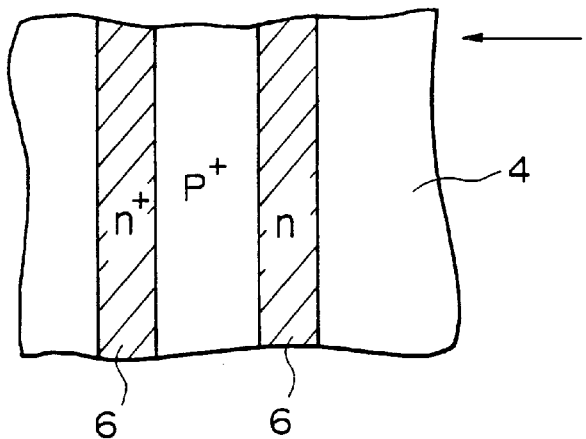
FIGS. 5a and 5b is a section at the pn junction 5.
Figure 5B:
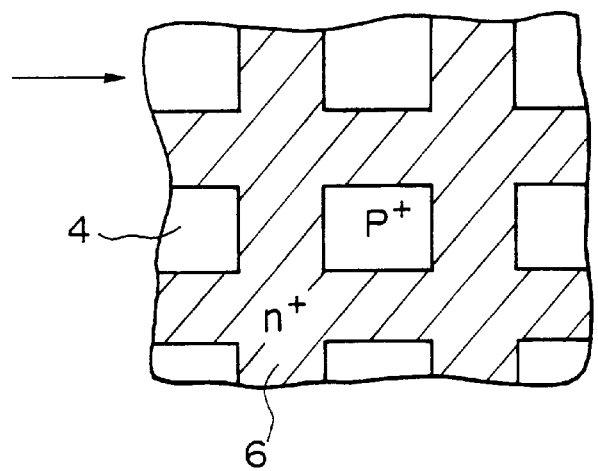
Figure 6:
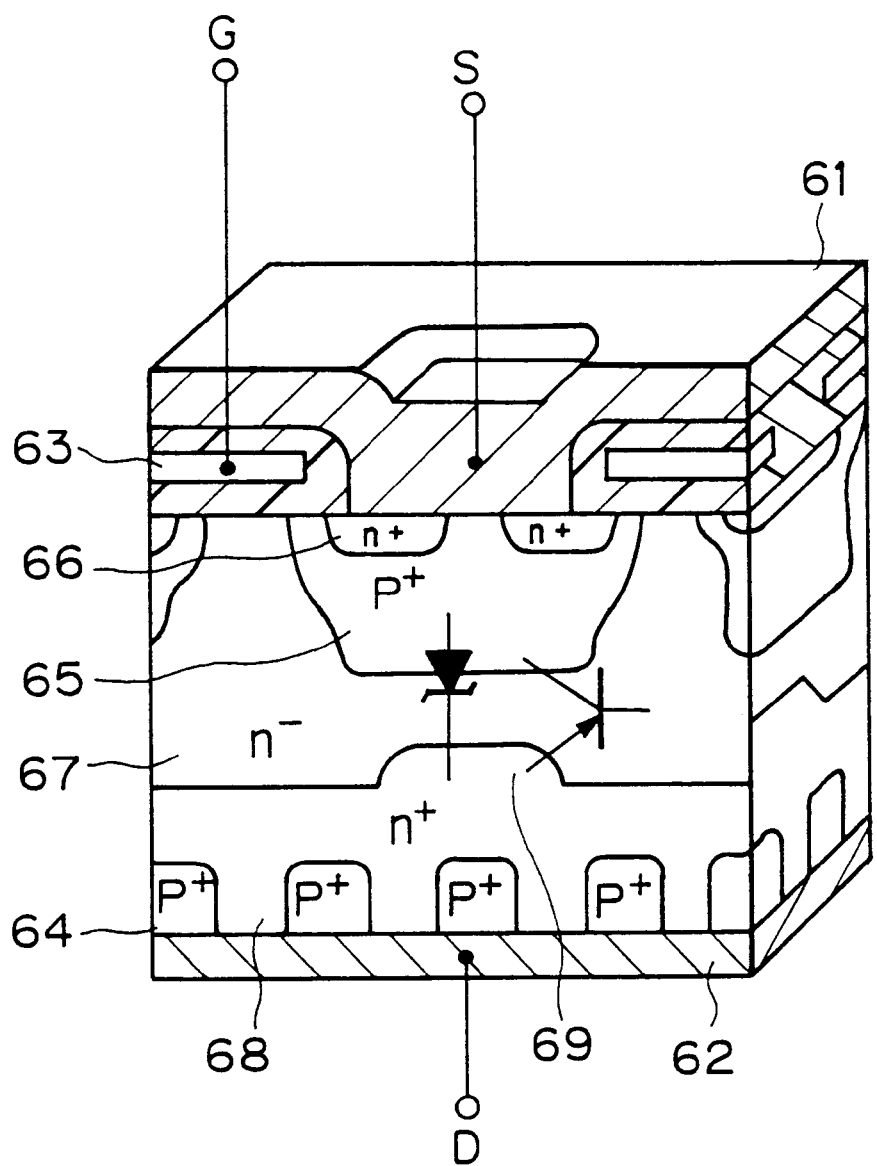
FIG. 6 is a partially sectioned perspective view of the conventional IGBT element integrally incorporating a constant voltage diode having an operational principle of avalanche breakdown.

FIG. 5 shows the section at pn junction 5, and FIG. 5(a) shows the first embodiment where the n⁺ type layer 6 is formed as the sprite pattern and FIG. 5(b) shows the second embodiment where the n⁺ type layer 6 is formed as the net.

Furthermore, although the foregoing embodiments have been discussion in terms of an n channel type IGBT, in which the first conduction type is a p type and the second conduction type is a n type, the present invention is equally applicable for a p channel type IGBT, in which the conduction types are reversed.

We claim:

1. An insulated gate type bipolar-transistor comprising:

a first layer made of a first conduction type semiconductor;

a second layer made of a second conduction type semiconductor interfacing with said first layer;

a third layer made of said first conduction type semiconductor partially formed in said second layer so that a junction between said second and third layers is terminated at a surface of said second layer;

a fourth layer made of said second conduction type semiconductor partially formed in said third layer so that a junction between said third and fourth layers is terminated at a surface of said third layer;

a gate electrode formed on a channel region established by the surface of said third layer between said second layer and said fourth layer, via a gate insulation layer;

a source electrode having contacting portions on both of said third and fourth layers; and a drain electrode for supplying drain current through said first layer;

wherein said second layer has an impurity concentration $N_D$ and a predetermined thickness so that when a bias voltage which does not form a channel in said channel region of said third layer is applied to said gate electrode against said source electrode, and a voltage which expands a depletion region from a pn junction plane between said second layer and said third layer toward said second layer and is lower than the voltage which corresponds to a critical electric field $E_{CRIT}$ to produce an avalanche breakdown in or at the vicinity of said second layer is applied between said drain electrode and said source electrode, said depletion region reaches said first layer and minority carriers are injected from said first layer to said second layer, and wherein a distance $t_e$ between said pn junction plane formed by said second layer and said third layer and a pn junction plane formed by said first layer and said second layer is selected so as to be shorter than a distance $W_{CRIT}$, wherein:

$$W_{CRIT} = K_S \cdot \epsilon_0 \cdot E_{CRIT}/(q \cdot N_D),$$

and wherein $C_{CRIT}$ represents a distance between said an junction plane formed by said second layer and said third layer and a pn junction plane formed by said first player and said second layer at which avalanche breakdown will occur when said electric field $E_{CRIT}$ is generated and when said second layer has said impurity concentration $N_D$, $K_S$ is a relative dielectric constant, $\epsilon_0$ is a dielectric constant at vacuum, and q is an elemental amount of charge.

2. An insulated gate type bipolar-transistor as set forth in claim 1, which further comprises a fifth layer made of a second conduction type semiconductor disposed at or in the vicinity of a junction between said first layer and said second layer, said fifth layer having a higher impurity concentration than said second layer and formed into a predetermined configuration leaving a contact surface between said first and second layers for transferring a carrier there through.

3. An insulated gate type bipolar-transistor as set forth in claim 2, wherein the predetermined pattern of said fifth layer has a cyclic repeated pattern at or in the vicinity of the interface between said first and second layers.

4. An insulated gate type bipolar-transistor as set forth in claim 2, wherein said predetermined pattern of said fifth layer is a net shaped or stripe shaped configuration.

5. An insulated gate type bipolar-transistor as set forth in claim 3, wherein said predetermined pattern of said fifth layer is a net shaped or stripe shaped configuration.

6. An insulated gate type bipolar-transistor as set forth in claim 1, wherein said second layer defined between said third layer and said first layer is of a single layer having said impurity concentration $N_D$.

7. An insulated gate type bipolar-transistor comprising:
a first layer being made of a first conduction type semiconductor;
a second layer being made of a second conduction type semiconductor interfacing with said first layer;
a third layer being made of said first conduction type semiconductor formed in said second layer and having a higher impurity concentration than said second layer for forming a step junction with said second layer;
a fourth layer being made of said second conduction type semiconductor formed in said third layer and distanced from said second layer by a predetermined dimension;
a gate electrode being formed on a channel region established by a portion of said third layer left between said second layer and said fourth layer for said predetermined dimension via a gate insulation layer;
a source electrode having a contact portion on both said third and fourth layers; and
a drain electrode supplying a drain current through said first layer, wherein an impurity concentration $N_D$ of said second layer and a distance $t_e$ between said step junction between said second layer and said third layer and a junction between said second layer and said first layer is set so that:

$$t_e < \{2 \cdot K_S \cdot \epsilon_0 \cdot V_R / (q \cdot N_D)\}^{1/2},$$

wherein $$\{2 \cdot K_S \cdot \epsilon_0 \cdot V_R / (q \cdot N_D)\}^{1/2} = K_S \cdot \epsilon_0 \cdot E_{CRIT} / (q \cdot N_D),$$

and wherein $K_S$ is a relative dielectric constant, $\epsilon_0$ is a dielectric constant at vacuum, and q is an elemental amount of charge, $E_{CRIT}$ is an electrical field that produces an avalanche breakdown in a vicinity of said step junction between said second layer and said third layer, and $V_R$ is a voltage applied between said drain electrode and said source electrode that is lower than a voltage necessary to generate $E_{CRIT}$ when a bias voltage which does not form a channel in said channel region of said third layer is applied to said gate electrode against said source electrode.

8. An insulated gate type bipolar-transistor as set forth in claim 7, wherein the material for the semiconductors is silicon, said second layer has the impurity concentration $N_D$ of $2.0 \times 10^{14}$ cm$^{-3}$, and thickness $t_e$ of 48 µm so that when 350V is applied between the source and the drain, a vertical transistor taking said first layer as an emitter, said second layer as a base and said third layer as a collector is punched through.

9. An insulated gate type bipolar-transistor as set forth in claim 7, wherein said second layer defined between said third layer and said first layer is of a single layer having said impurity concentration $N_D$.

10. An insulated gate type bipolar transistor comprising:
a first semiconductor layer of a first conductivity type;
a second semiconductor layer of a second conductivity type being disposed on said first semiconductor layer;
a third semiconductor layer of said first conductivity type selectivity being disposed at a surface of said second semiconductor layer;
a fourth semiconductor layer of said second conductivity type selectively being formed at a surface of said third semiconductor layer, said third semiconductor layer being between said second semiconductor layer and said fourth semiconductor layer and serving as a channel region;
a gate electrode being disposed over said channel region with a gate insulating film interposed therebetween;
a source electrode being electrically connected to both said third and said fourth semiconductor layers;
a drain electrode being electrically connected to said first semiconductor layer to supply a drain current through said first semiconductor layer; and
a guard ring structure being disposed at said surface of said second semiconductor layer for improving a breakdown voltage,
wherein an impurity concentration and a distance of said second semiconductor layer positioned between said third semiconductor layer and said first semiconductor layer are selected such that a depletion region extending from a pn junction between said third and said second semiconductor layers toward an inside of said second semiconductor layer reaches said first semiconductor layer under a drain-to-source voltage that is lower than a voltage causing an avalanche breakdown of said pn junction responsive to said pn junction being reverse biased when a bias voltage which does not form a channel in said channel region of said third semiconductor layer is applied to said gate electrode against said source electrode.

11. An insulated gate type bipolar transistor according to claim 10, further comprising a fifth semiconductor layer of said second conductivity type disposed at least in a vicinity of a junction between said first and second semiconductor layers, said fifth semiconductor layer having an impurity concentration higher than said second semiconductor layer and having a window which allows said first semiconductor layer to contact said second semiconductor layer directly.

12. An insulated gate type bipolar transistor according to claim 11, wherein said fifth semiconductor layer has one of a net-shaped and stripe-shape pattern.

13. An insulated gate type bipolar transistor comprising:
a semiconductor substrate of a first conductivity type;
a semiconductor layer of a second conductivity type being disposed on said semiconductor substrate, said semiconductor layer having a first region and a second region abutting said first region;

base layers of said first conductivity type being disposed in said semiconductor layer at a surface of said first region;

source layers of said second conductivity type being disposed in each based layer, each base layer constituting a portion of a respective unit cell, a junction of each source layer within a corresponding base layer terminating at a surface thereof and at a spacing from a junction between said corresponding base layer and said semiconductor layer:

a gate electrode being located in said first region such that said gate electrode overlaps at least a channel region with a gate insulating film interposed therebetween, said channel region being defined by said spacing;

a source electrode being electrically connected to both said corresponding base layer and a corresponding one of said source layers in each of said unit cells;

a drain electrode being electrically connected to said semiconductor substrate; and at least one guard ring layer of said first conductivity type being disposed in said semicondcutor layer at a surface of said second region, a junction of said guard ring layer terminating at said surface of said second region, wherein an impurity concentration of said semiconductor layer and a distance between said each base layer and said semiconductor substrate are selected so as to allow a punch-through between said base layers and said semiconductor substrate so that no avalanche breakdown occurs in said semiconductor layer when a bias voltage which does not form a channel in said channel region is applied to said gate electrode against said source electrode.

14. An insulated gate type bipolar transistor according to claim 13, further comprising a buried layer of said second conductivity type disposed at least in a vicinity of a pn junction between said semiconductor substrate and said semiconductor layer, said buried layer having an impurity concentration higher than said semiconductor layer and having a window which allows said semiconductor substrate to contact said semiconductor layer directly.

15. An insulated gate type bipolar transistor according to claim 14, wherein said buried layer has one of a net-shaped and striped-shaped pattern.

* * * * *